US007738022B2

(12) United States Patent
Shimono et al.

(10) Patent No.: US 7,738,022 B2
(45) Date of Patent: Jun. 15, 2010

(54) TRANSFER PULSE GENERATOR CIRCUIT AND IMAGE PICKUP APPARATUS

(75) Inventors: Takashi Shimono, Fukuoka (JP); Hiroyasu Tagami, Fukuoka (JP)

(73) Assignee: Sony Corporation, Tokyo (JP)

( * ) Notice: Subject to any disclaimer, the term of this patent is extended or adjusted under 35 U.S.C. 154(b) by 446 days.

(21) Appl. No.: 11/620,912

(22) Filed: Jan. 8, 2007

(65) Prior Publication Data

US 2008/0246870 A1 Oct. 9, 2008

(30) Foreign Application Priority Data

Jan. 13, 2006 (JP) ........................... P2006-006652
Oct. 18, 2006 (JP) ........................... P2006-283535

(51) Int. Cl.
*H04N 3/14* (2006.01)
*H04N 5/335* (2006.01)

(52) U.S. Cl. ........................ 348/312; 348/294; 348/311

(58) Field of Classification Search ................. 348/241, 348/294, 311, 312
See application file for complete search history.

(56) References Cited

U.S. PATENT DOCUMENTS 4,748,507 A * 5/1988 Gural ...................... 348/219.1

FOREIGN PATENT DOCUMENTS

| | | |
|---|---|---|
| JP | 61-143595 | 1/1988 |
| JP | 06-176767 | 2/1996 |
| JP | 2000-138943 | 5/2000 |
| JP | 2000-099413 | 10/2001 |
| JP | 2000-182078 | 1/2002 |

* cited by examiner

*Primary Examiner*—David L Ometz
*Assistant Examiner*—Richard M Bemben
(74) *Attorney, Agent, or Firm*—Sonnenschein Nath & Rosenthal LLP

(57) ABSTRACT

A transfer pulse generator circuit for outputting a vertical register transfer pulse includes transfer pulse control means for controlling to set rise and fall timings of the vertical register transfer pulse to desired timings in a predetermined period.

7 Claims, 16 Drawing Sheets

HD
1
TIMING GENERATOR
HORIZONTAL DIRECTION COUNTER
2
CMP
PRM_OFFSET
3
7
Vφ GENERATOR
Vφ1
Vφ2
Vφ3
Vφ4
Vφ5
Vφ6
CCD
5
RANDOM NUMBER GENERATOR CIRCUIT
RD_OFFSET
CMP
T COUNTER
8
RD COUNTER
6
4

CCD
TIMING GENERATOR
1
Vφ1
Vφ2
Vφ3
Vφ4
Vφ5
Vφ6
Vφ GENERATOR
T COUNTER
8
7
CMP
6
RD_OFFSET
5
RANDOM NUMBER GENERATOR CIRCUIT
RD COUNTER
4
CMP
3
2
HD
HORIZONTAL DIRECTION COUNTER
PRM_OFFSET

HD
Hck
Vφ1
Vφ2
Vφ3
Vφ4
Vφ5
Vφ6
VOG
T1
T2
T3
T4
T5
T6
T7
T8
T9
T10
T11
T12
Ta
Tb
Tc
a
A
B
C
D
X

TIMING GENERATOR
1
CCD
Vφ1
Vφ2
Vφ3
Vφ4
Vφ5
Vφ6
7
Vφ GENERATOR
T COUNTER
8
SELECTOR
0
1
11
RANDOM EN
15
6
CMP
12
14
4b
RD_OFFSET
HD
HORIZONTAL DIRECTION COUNTER
2
3
CMP
PRM_OFFSET
RANDOM EN
10
4a
RD COUNTER ①
BASE 32 RANDOM NUMBER GENERATOR ①
RD COUNTER ②
BASE 1 TO 8 RANDOM NUMBER GENERATOR ②
13
RANDOM SELECT

A
CLK
V2
V4
V6
V8
H2
SUB

TRANSFER PULSE GENERATOR CIRCUIT AND IMAGE PICKUP APPARATUS

CROSS REFERENCES TO RELATED APPLICATIONS

The present application contains subject matter related to Japanese Patent Application JP 2006-006652 filed in the Japanese Patent Office on Jan. 13, 2006 and JP 2006-283535 filed in the Japanese Patent Office on Oct. 18, 2006, the entire contents both of which being incorporated herein by reference.

BACKGROUND OF THE INVENTION

1. Field of the Invention

The present invention relates to a transfer pulse generator circuit and an image pickup apparatus. More particularly, the present invention relates to a transfer pulse generator circuit for generating vertical register transfer pulses for driving vertical registers of a charge coupled device (CCD) type solid state image pickup device, and an image pickup apparatus equipped with a CCD type solid state image pickup device having the transfer pulse generator circuit.

2. Description of Related Art

In an image pickup apparatus equipped with a CCD type solid state image pickup device, charges accumulated in each light reception element provided in a light reception part of the CCD type solid state image pickup device are transferred to a vertical register, the charges transferred to each vertical register are transferred to a horizontal register, and the charges transferred to the horizontal register are transferred to an output circuit. An output from the output circuit is image information.

A period constituting one screen of a video device such as a display and a TV is called one frame. In the interlace system, for example, two fields constitute one frame.

Image information of one field or one frame is repetitively output so that images can be viewed on a video device as still images or moving images.

When charges are transferred in the horizontal register, the horizontal register is driven in a state that the operations of vertical registers are stopped, to extract charge information of one horizontal line (e.g., refer to FIG. 3 of Japanese Patent Application Publication No. 2000-138943). Pixel information on one frame can be transferred basically by outputting charge information on one horizontal line by a plurality of times corresponding to the number of horizontal lines.

Specifically, as shown in a timing chart of FIG. 5, vertical register transfer is performed during a horizontal blanking period (period indicated by a symbol b in the drawing) while a horizontal register transfer pulse indicated by a symbol Hck in the drawing holds a constant level (high level in the timing chart of FIG. 5), in order to avoid adverse effects of switching pulses of vertical register transfer pulses indicated by a symbol Vϕ (Vϕ1 to Vϕ6) during an effective pixel period (period indicated by a symbol a.

Namely, a potential variation of a substrate formed with a CCD type solid state image pickup device occurs at vertical register transfer pulse fall timings (timings indicated by symbols T2, T4, T6, T8, T10 and T12 in the drawing) and at vertical register transfer pulse rise timings (timings indicated by symbols T1, T3, T5, T7, T9, and T11 in the drawing). In order to avoid an adverse effect of this potential variation upon an output from the output circuit, the vertical register transfer is performed during the horizontal blanking period.

FIG. 6 is a graph showing a relation between the vertical register transfer pulse Vϕ and a potential of a substrate on which a CCD type solid state image pickup device is formed. It can be seen from this graph that when a vertical register transfer pulse falls at a pulse through rate of 40 V/μs, the potential of the substrate formed with the CCD type solid state image pickup device changes by about 16 mV.

FIG. 7 is a schematic diagram showing a timing generator equipped with a conventional transfer pulse generator circuit. A timing generator 101 shown in the drawing is constituted of: a horizontal direction counter 102 which starts counting synchronously with a fall of a horizontal sync signal HD; PRM_OFFSET which stores a count (Ta value) of the horizontal direction counter from the fall timing of the horizontal sync signal HD to a timing indicated by a symbol T1 in FIG. 5; a comparator 103 which compares the count of the horizontal direction counter and the Ta value and outputs a reference signal when the count of the horizontal direction counter reaches the Ta value; and a Vϕ generator 104 which generates a Vϕ pulse by using the reference signal output from the comparator as a trigger.

The Vϕ generator is equipped with a T counter 105, and is structured in such a manner that when the timing indicated by T1 is identified by the reference signal output from the comparator, the T counter counts timings indicated by T2 to T12 to identify them. Namely, the T counter provided in the Vϕ generator operates in such a manner that Vϕ pulses can be generated at the timings indicated by T2 to T12 without instructing the Vϕ generator externally, by making the Vϕ generator know only the timing indicated by T1 by using the reference signal.

In the timing generator constructed as above, by using the fall of the horizontal sync signal HD which is a signal externally input, as a reference, the horizontal direction counter starts counting. When the count of the horizontal direction counter reaches the Ta value (e.g., count 100) stored in PRM_OFFSET, the comparator outputs the reference signal. By using the reference signal output from the comparator as a trigger, the Vϕ generator generates each pulse of Vϕ1 to Vϕ6, so that the vertical register transfer pulses of one horizontal line shown in FIG. 5 can be obtained. One horizontal transfer and corresponding one vertical transfer (period a+period b) are called a vertical transfer period.

Pixel information on one frame is transferred as the same vertical transfer period is transferred a plurality of times corresponding to the number of horizontal pixels (although a variety of transfer modes such as pixel thinning are used recently, these are not included).

The number of pixels of a CCD type solid state image pickup device is increasing nowadays because of market need for high image quality. Need for acquiring a number of images at the same time in a short time are also increasing. It is desired to realize a frame rate near a conventional frame rate also for a CCD type solid image pickup device having a large number of pixels.

A method of realizing a frame rate near a conventional frame rate also for a CCD type solid image pickup device having a large number of pixels may be: (1) a method of raising a drive frequency at which a CCD type solid state image pickup device is driven; and (2) a method of performing a vertical register transfer during an effective pixel period.

However, if a frame rate near a conventional frame rate is realized by raising the drive frequency at which a CCD type solid state image pickup device is driven, a rise in the drive frequency may cause an increase in a calorific power, an increase in a power consumption, high cost of a substrate formed with a CCD type solid state image pickup device, an increase in the number of peripheral components and the like.

It is therefore difficult to say that the method of raising a drive frequency at which a CCD type solid state image pickup device is driven, to realize a frame rate near a conventional frame rate, is proper. Further, if only the countermeasure of raising the drive frequency is used, a limit is approaching for the recent requirements for improving the frame rate.

If a frame rate near a conventional frame rate is realized by performing a vertical register transfer during an effective pixel period, there arises, as described earlier, adverse influence of switching noises of vertical register transfer pulses. Namely, a potential of a substrate formed with a CCD type solid state image pickup device changes at rise/fall timings of each vertical register transfer pulse, so that an output of the output circuit may be adversely affected and fixed pattern noises (FPN) may be generated.

Specifically, as shown in a timing chart shown in FIG. 8, as a vertical register transfer is performed during an effective pixel period (period indicated by a symbol a in the drawing), a potential of the substrate formed with a CCD type solid state image pickup device changes: at a rise timing T1 of a vertical register transfer pulse indicated by a symbol Vϕ6; at a fall timing T2 of a vertical register transfer pulse indicated by a symbol Vϕ2; at a rise timing T3 of a vertical register transfer pulse indicated by a symbol Vϕ1; at a fall timing T4 of a vertical register transfer pulse indicated by a symbol Vϕ3; at a rise timing T5 of a vertical register transfer pulse indicated by a symbol Vϕ2; at a fall timing T6 of a vertical register transfer pulse indicated by a symbol Vϕ4; at a rise timing T7 of a vertical register transfer pulse indicated by a symbol Vϕ3; at a fall timing T8 of a vertical register transfer pulse indicated by a symbol Vϕ5; at a rise timing T9 of a vertical register transfer pulse indicated by a symbol Vϕ4; at a fall timing T10 of a vertical register transfer pulse indicated by a symbol Vϕ6; at a rise timing T11 of a vertical register transfer pulse indicated by a symbol Vϕ5; and at a fall timing T12 of a vertical register transfer pulse indicated by a symbol Vϕ1. This potential change may generate FPN at each of the change timings T1 to T12.

FPNs generated at respective change timings T1 to T12 are coupled vertically, and vertical linear image noises such as shown in FIG. 9A appear. FIG. 12 shows an actual image obtained by driving a CCD type solid state image pickup device in accordance with the timing chart shown in FIG. 7. Similar to FIG. 9A, it can be known from FIG. 12 that vertical linear image noises appear which are caused by FPNs generated at respective change timings T1 to T12.

Consider similar mechanism for a spot noise on the screens between frames and between fields. Image noises appear always at the same position between frames or fields. Therefore, a certain spot on the screen becomes always noises (dark or bright). These noises are spot noises staying resident on the screen irrespective of generation of vertical linear image noises.

Although these are two independent phenomena, the generation mechanism is the same in FPN and continuity (continuity of linear noises in the vertical transfer period, continuity of spot noises between frames or fields), so that if linear noises and spot noises are generated at the same time, the linear noises always appear on the screen.

Vertical register transfer pulses shown in FIG. 8 can be generated in a manner similar to that for the vertical register transfer pulses shown in FIG. 5. Namely, by using the timing generator shown in FIG. 7, the vertical register transfer pulses shown in FIG. 8 can be generated.

SUMMARY OF THE INVENTION

The present invention has been made in view of the above-described issued. There is need for providing a transfer pulse generator circuit capable of mitigating visual recognition of image noises on a screen of a video device such as a display, a TV and a monitor even if a vertical register transfer is performed in an effective pixel period, and an image pickup apparatus having the transfer pulse generator circuit of this type.

In order to solve the above-described issues, a transfer pulse generator circuit for outputting a vertical register transfer pulse of the present invention, includes: transfer pulse control means for controlling to set rise and fall timings of the vertical register transfer pulse to desired timings in a predetermined period.

The transfer pulse control means for controlling to set rise and fall timings of the vertical register transfer pulse to desired timings in a predetermined period can make the rise and fall timings of the vertical register transfer pulse different at each horizontal line so that timings of switching noises can be made different at each horizontal line. By making the timing of a potential change of a substrate formed with a CCD type solid state image pickup device different at each horizontal line, it is possible to make hard to visually recognize linear image noises in a vertical direction. Similarly, it is possible to make hard to visually recognize spot image noises on a screen, by making the rise and fall timings of the vertical register transfer pulse different at each field and/or frame.

Namely, the linear image noises in the vertical direction can be visually recognized because the timings when switching noises are generated are the same for all horizontal lines and FPNs are coupled in the vertical direction. Therefore, vertical linear image noises and spot image noises can be made hard to be visually recognized, by making the timings of generation of switching noises different at each horizontal line, or at each field and/or frame, to suppress coupling of FPNs in the vertical direction and staying resident of spot image noises on the screen.

The "predetermined period" means a period while a vertical register transfer is not adversely affected. Namely, this period means a period while the vertical register transfer is not adversely affected, even if the rise and fall timings of the vertical register transfer pulse are changed.

A transfer pulse generator circuit of the present invention includes: reference signal output means for outputting a reference signal for generating a vertical register transfer pulse; and transfer pulse generator means for generating the vertical register transfer pulse by using the reference signal as a trigger, wherein the reference signal output means outputs the reference signal at a desired timing in a predetermined period.

The reference signal output means outputs the reference signal at a desired timing in the predetermined period, and the transfer pulse generator means generates the vertical register transfer pulse by using as a trigger the reference signal output at the desired timing in the predetermined period. It is therefore possible to make the rise and fall timings of the vertical register transfer pulse different at each horizontal line and make the timings of switching noises different at each horizontal line. Therefore, it is possible to make the timing of a potential change of the substrate formed with a CCD type solid state image pickup device different at each horizontal line. By making the timing of a potential change of the substrate formed with a CCD type solid state image pickup device different at each horizontal line, it becomes possible to make hard to visually recognize linear image noises in the vertical direction. Similarly, by making the rise and fall timings of the vertical register transfer pulse different at each field and/or frame, it becomes possible to make hard to visually recognize spot image noises on a screen.

The "predetermined period" means a period while the vertical register transfer pulse can be generated in the period while the vertical register transfer is not adversely affected. Namely, this period means a period while the vertical register transfer pulse can be generated which does not adversely affect the vertical register transfer even if the timing when the reference signal is output from the reference signal output means is changed.

In order to solve the above-described issues, an image pickup apparatus of the present invention has a transfer pulse generator circuit, the transfer pulse generator circuit including: reference signal output means having a first counter for counting a clock used as a reference, a first comparator for comparing a count of the first counter and a first predetermined value and outputting a signal, a second counter for counting the clock by using the signal as a trigger, and a second comparator for comparing a count of the second counter and a second predetermined value and outputting a reference signal; and transfer pulse generator means for generating a vertical register transfer pulse by using the reference signal as a trigger, wherein the second predetermined value is an output value of a random number generator circuit which outputs a desired value in a predetermined period.

The second predetermined value is set to an output value of the random number generator circuit for outputting a desired value in the predetermined period. It is therefore possible to make the rise and fall timings of the vertical register transfer pulse different at each horizontal line and make the timings of switching noises different at each horizontal line. Therefore, it is possible to make the timing of a potential change of the substrate formed with a CCD type solid state image pickup device different at each horizontal line. By making the timing of a potential change of the substrate formed with a CCD type solid state image pickup device different at each horizontal line, it becomes possible to make hard to visually recognize linear image noises in the vertical direction. The "predetermined period" means a period while the vertical register transfer pulse can be generated in the period while the vertical register transfer is not adversely affected. Namely, this period means a period while the vertical register transfer pulse can be generated which does not adversely affect the vertical register transfer by using as a trigger the reference signal output from the second comparator, even if the second predetermined value to be compared with the count of the second counter by the second comparator is changed.

With the transfer pulse generator circuit and image pickup apparatus of the present invention described above, it is possible to mitigate visual recognition of image noises on a screen of a video even if a vertical register transfer is performed in an effective pixel period.

BRIEF DESCRIPTION OF THE DRAWINGS

The present invention will become more readily appreciated and understood from the following detailed description of embodiments and examples of the present invention when taken in conjunction with the accompanying drawings, in which.

DESCRIPTION OF THE INVENTION

Figure 5:
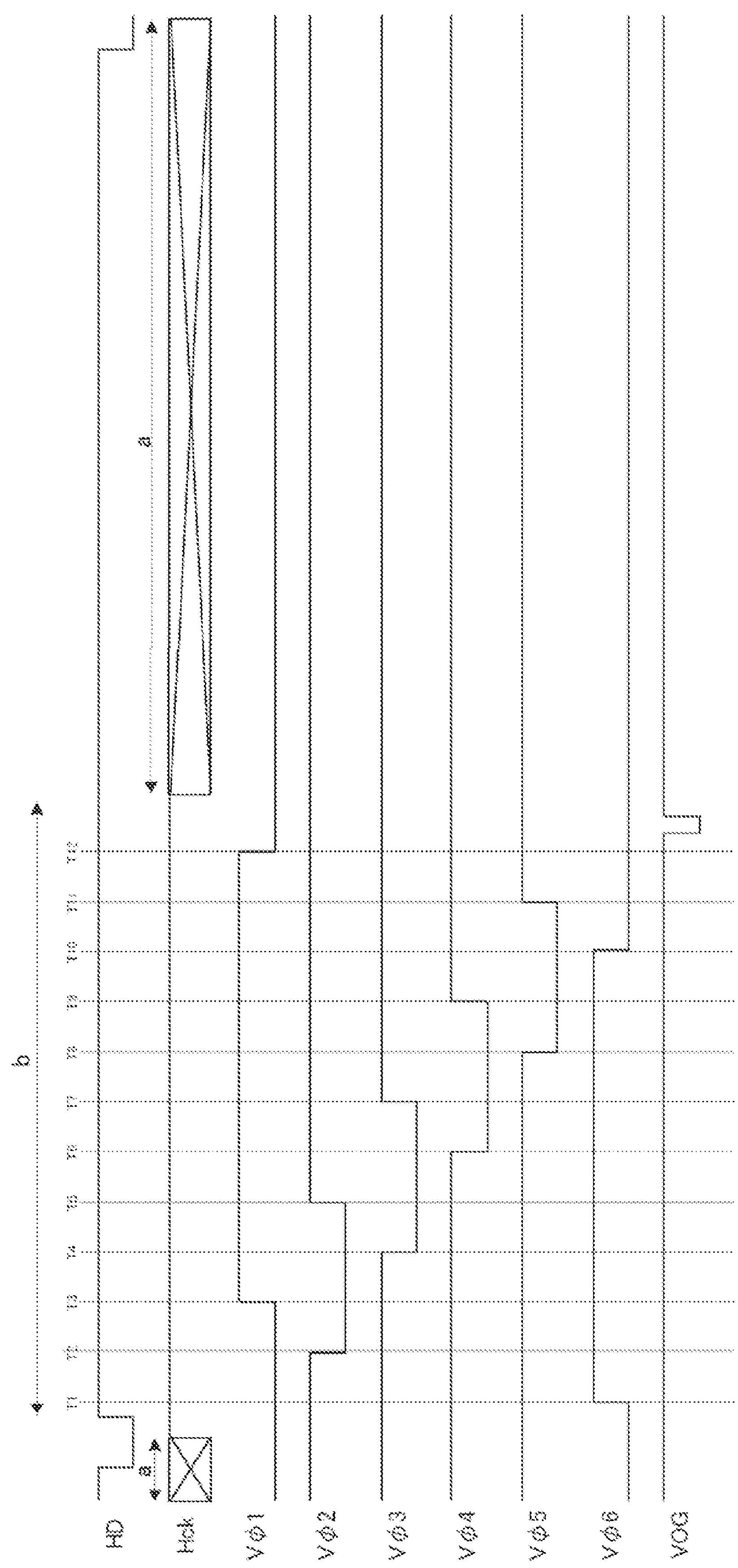
FIG. 5 is an example of a timing chart illustrating a driving method which does not perform a vertical register transfer during an effective pixel period.
Figure 6:
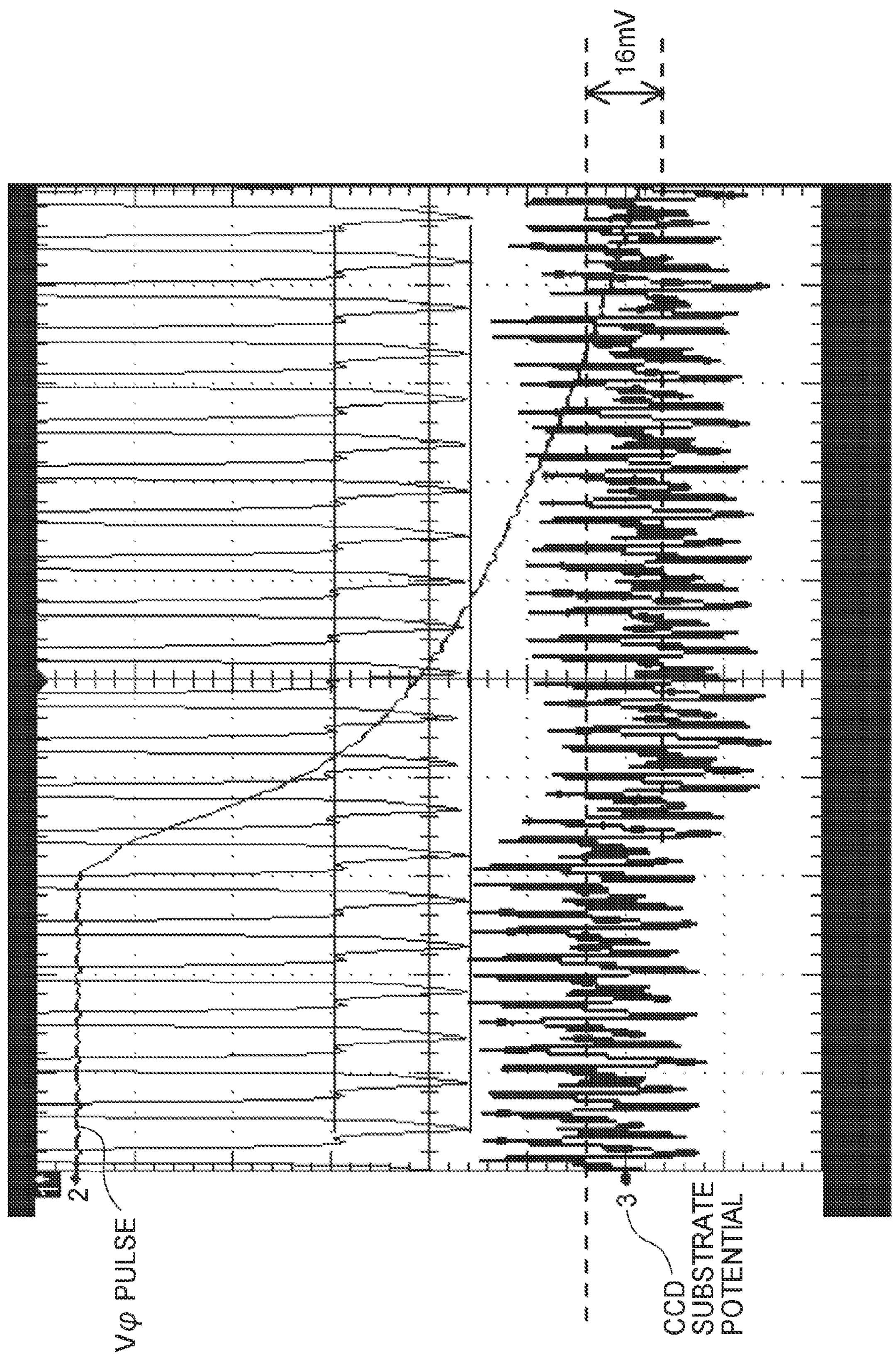
FIG. 6 is a graph showing a relation between a vertical register transfer pulse Vϕ and a potential of a substrate formed with a CCD type solid state image pickup device.

In the embodiments to be described hereunder, description will be made on the generation of basic timings by illustratively using pulses Vϕ1 to Vϕ6 similar to those shown in the timing charts of FIGS. 5 and 8. A rise timing of the pulse Vϕ6 is T1, a fall timing of the pulse Vϕ2 is T2, a rise timing of the pulse Vϕ1 is T3, a fall timing of the pulse Vϕ3 is T4, a rise timing of the pulse Vϕ2 is T5, a fall timing of the pulse Vϕ4 is T6, a rise timing of the pulse Vϕ3 is T7, a fall timing of the pulse Vϕ5 is T8, a rise timing of the pulse Vϕ4 is T9, a fall timing of the pulse Vϕ6 is T10, a rise timing of the pulse Vϕ5 is T11, and a fall timing of the pulse Vϕ1 is T12.

Figure 1:
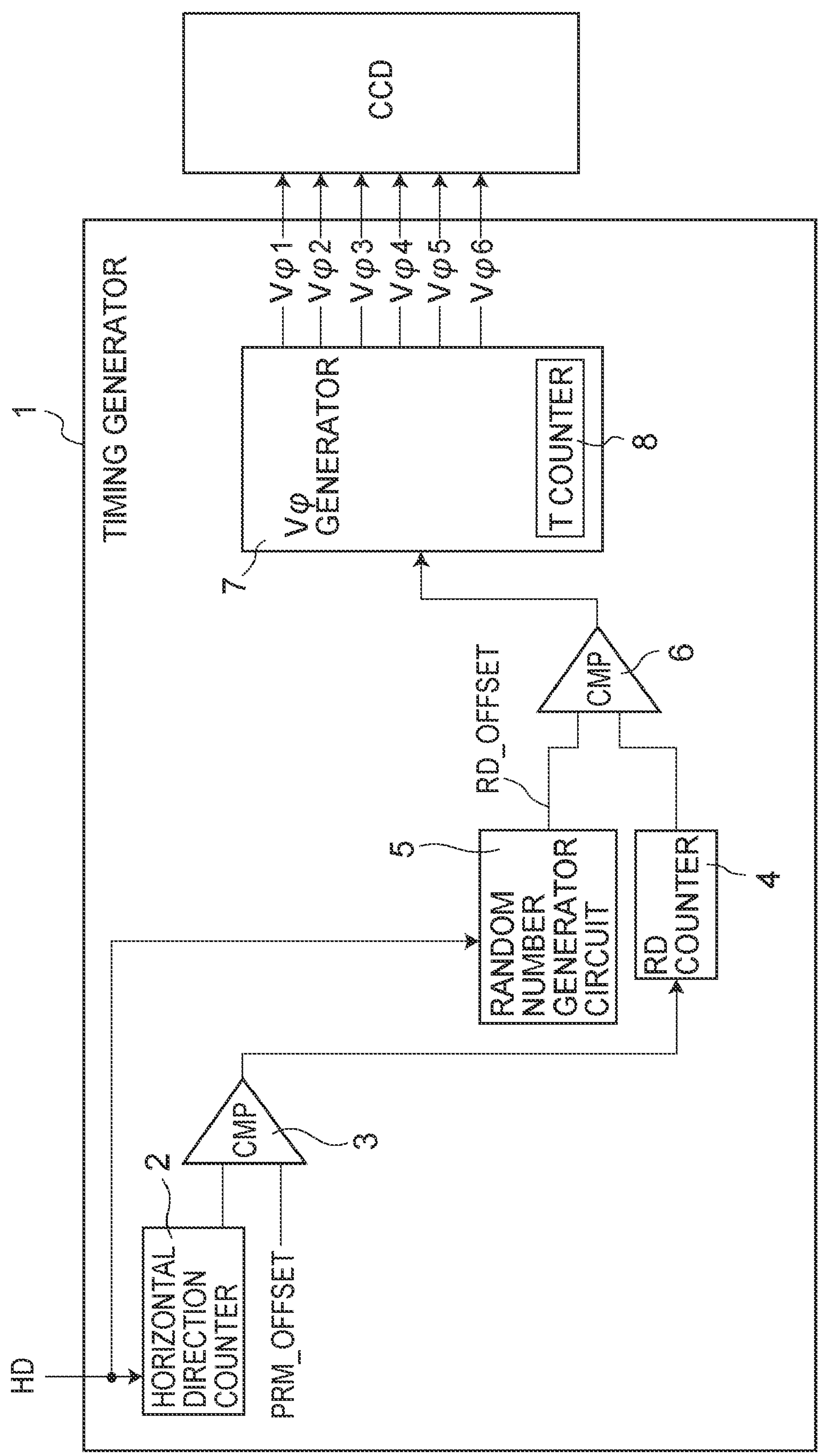
FIG. 1 is a schematic diagram for explaining a timing generator equipped with an example of a transfer pulse generator circuit applying the present invention.

FIG. 1 is a schematic diagram showing a timing generator equipped with an example of a transfer pulse generator circuit applying the present invention. A timing generator 1 shown in the drawing is constituted of: a horizontal direction counter 2 which starts counting synchronously with a fall of a horizontal sync signal HD; PRM_OFFSET which stores a count (Ta value) of the horizontal direction counter from the fall timing of the horizontal sync signal HD to a timing T1; a first comparator 3 which compares the count of the horizontal direction counter and the Ta value and outputs a first output signal when the count of the horizontal direction counter reaches the Ta value; an RD counter 4 which starts counting by using the first output signal output from the first comparator as a reference; a random number generator circuit 5 for determining an RD_OFFSET value which is an arbitrary value in a predetermined period, by using the fall of the horizontal sync signal HD as a trigger; a second comparator circuit 6 for comparing a count of the RD counter and the RD_OFFSET value and outputs a second output signal when the count of the RD counter reaches the RD_OFFSET value; and a Vϕ generator 7 which generates a Vϕ pulse by using the second signal output from the second comparator as a trigger.

The entirety of the horizontal direction counter, PRM_OFFSET, first comparator, RD counter, random number generator circuit and second comparator constitute an example of transfer pulse control means.

The entirety of the horizontal direction counter, PRM_OFFSET, first comparator, RD counter, random number generator circuit and second comparator constitute also an example of reference signal output means. The Vϕ generator constitutes also an example of transfer pulse generator means. The horizontal direction counter constitutes also an example of a first counter, the first comparator constitutes also a first comparator, the RD counter constitutes also a second counter, and the second comparator also constitutes an example of a second comparator.

Similar to the conventional timing generator described earlier, the Vϕ generator is equipped with a T counter 8, and is structured in such a manner that when the timing T1 is identified by the second output signal output from the second comparator, the T counter counts timings T2 to T12 to identify them. Namely, the T counter provided in the Vϕ generator operates in such a manner that Vϕ pulses can be generated at the timings T2 to T12 without instructing the Vϕ generator externally, by making the Vϕ generator know only the timing T1 by using the second output signal.

Figure 2:
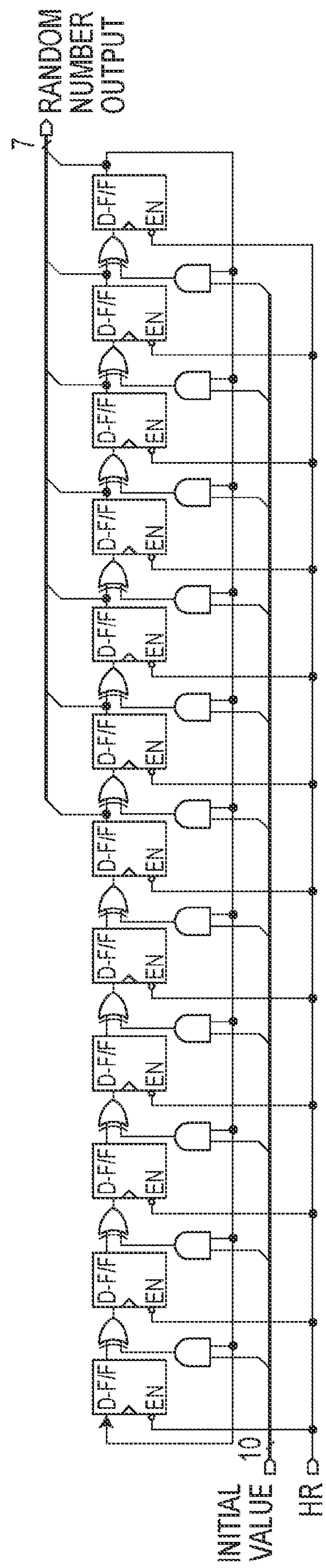
FIG. 2 is a circuit diagram of a linear feedback shift register (LFSR) as an example of a random number generator circuit.

FIG. 2 is a circuit diagram of a linear feedback shift register (LFSR) circuit which is an example of the random number generator circuit described above. The LFSR circuit is a counter constituted of a shift register fed back through ExOR. If the number of flip-flops is n, the number up to (2n−1) can be counted and a pseudo random number can be generated. For example, for a 7-bit random number output, random numbers of 128 steps can be generated including 0 to 127.

The LFSR circuit can change a dispersion degree of pseudo random numbers by setting an initial value when a power is turned on. It is therefore possible to change the dispersion degree of each type (pixel size or the like) of a CCD type solid state image pickup device.

In this embodiment, it is structured that an output random number of the LFSR circuit is updated at each fall timing of the horizontal sync signal HD.

Figure 14:
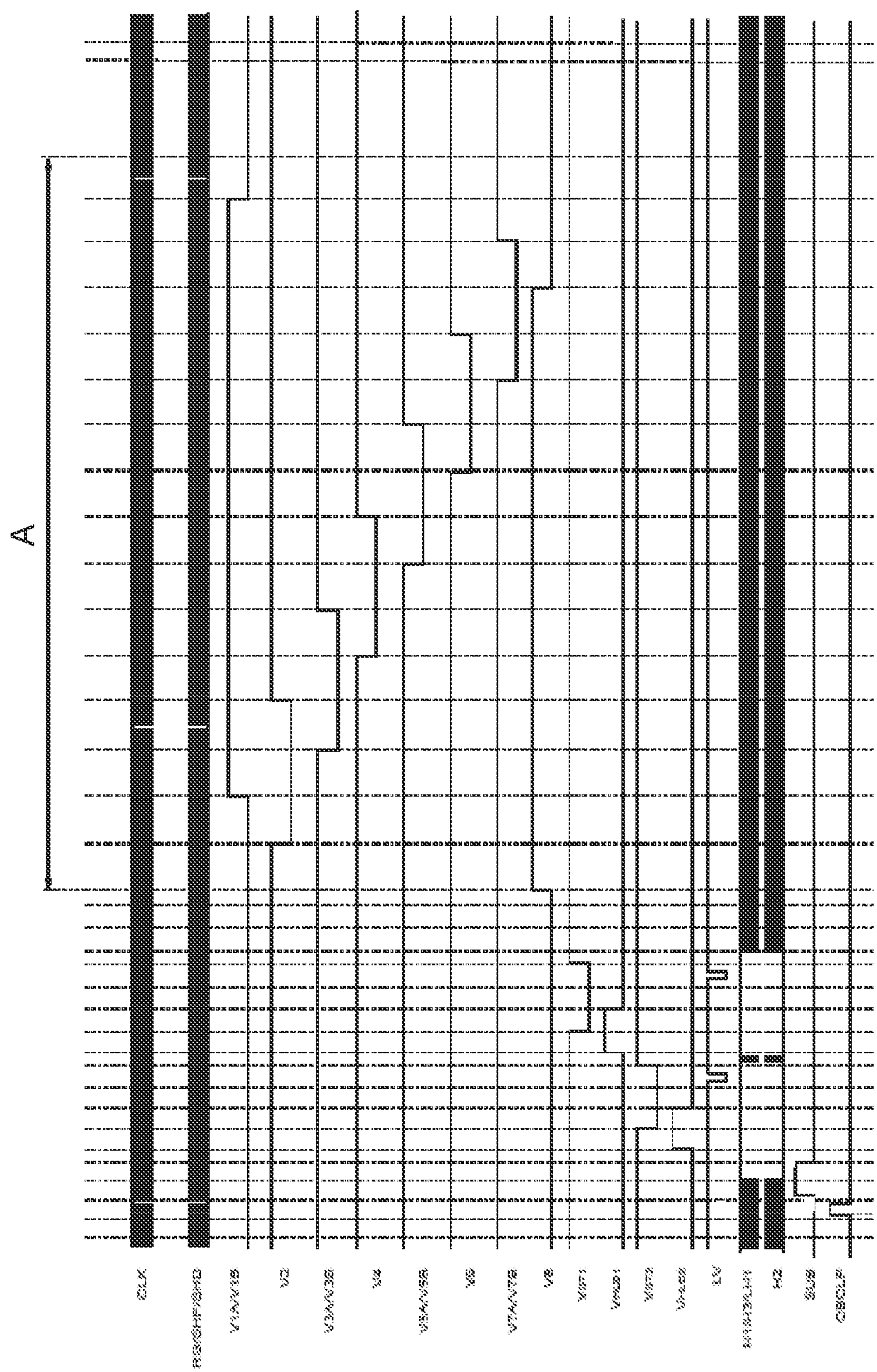
FIG. 14 is an example of vertical register transfer pulses generated by the timing generator according to the present invention.

In the timing generator constructed as shown in FIG. 1, the horizontal direction counter starts counting synchronously with a fall of the horizontal sync signal HD which is a signal input externally, and the first comparator outputs the first output signal when the count of the horizontal direction counter reaches the Ta value stored in PRM_OFFSET. The RD counter starts counting by using the first output signal output from the first comparator as a reference, and the second comparator circuit outputs the second output signal when the count of the RD counter reaches the RD_OFFSET value determined by the random number generator circuit. The Vϕ generator generates each of Vϕ pulses Vϕ1 to Vϕ6 by using the second output signal output from the second comparator as a trigger. In this way, vertical register transfer pulses of one horizontal line can be obtained. FIG. 14 shows actual vertical register transfer pulses generated by the timing generator shown in FIG. 1.

Figure 3A:
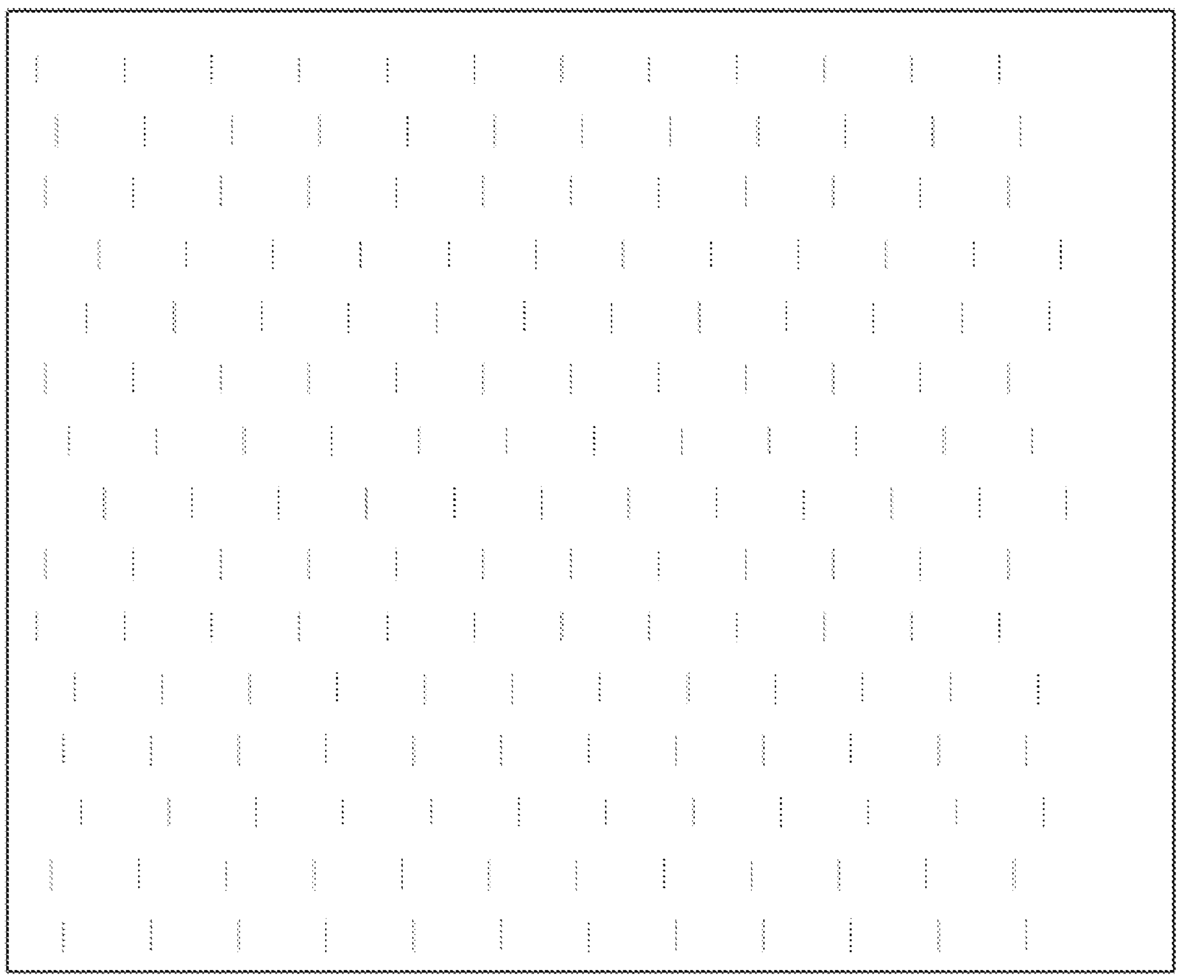
FIG. 3A is a schematic diagram for explaining random pattern noises.
Figure 13:
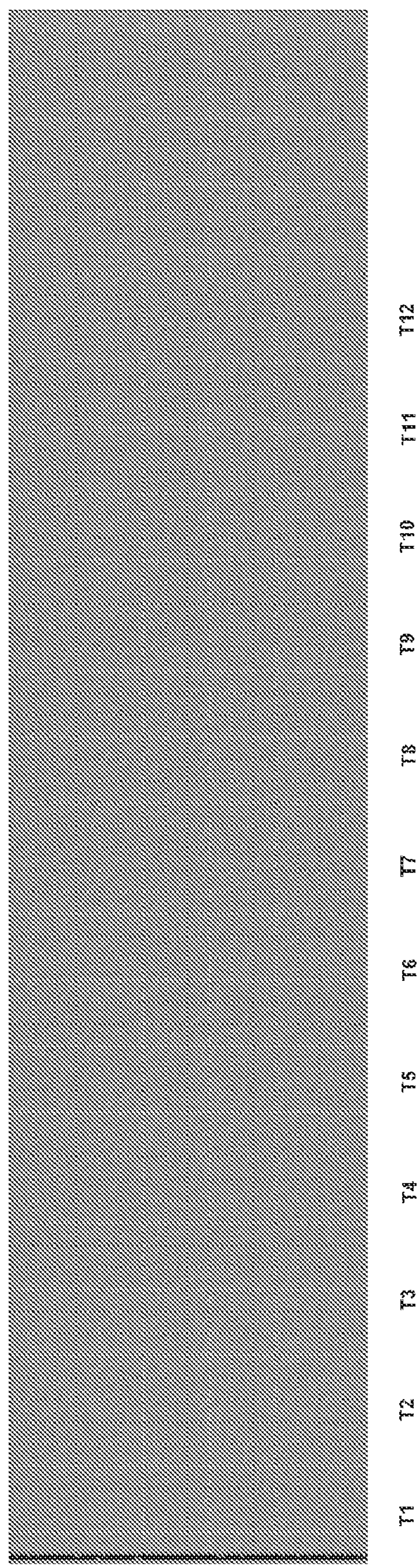
FIG. 13 is a screen image in which random noise pattern are suppressed by the application of the present invention.

The vertical register transfer pulses generated by the timing generator equipped with the transfer pulse generator circuit applying the present invention have different timings T1 to T12 at each horizontal line. Therefore, FPNs generated at respective change timings T1 to T12 at each horizontal line are not coupled in the vertical direction, and vertically coupled linear image noises are hard to be generated although random noise patterns such as shown in FIG. 3A are generated. FIG. 13 shows an actual screen obtained by driving a CCD type solid state image pickup device by using Vϕ pulses generated by the timing generator shown in FIG. 1. It can be understood also from FIG. 13 that vertical linear image noises are hard to appear.

Because of the same mechanism, the rise and fall timings of the vertical register transfer pulses are random between fields and/or frames, so that image noises staying resident on the screen are also hard to appear. It is preferable to provide a circuit for comparing counts of the RD counter at the rise of each vertical transfer period between frames or fields to strictly prevent the same value between fields and/or frames. It is clear from the verification made by the inventors that a probability of using the same value becomes low and image noises are not conspicuous if the random number generator circuit is used.

Figure 3B:
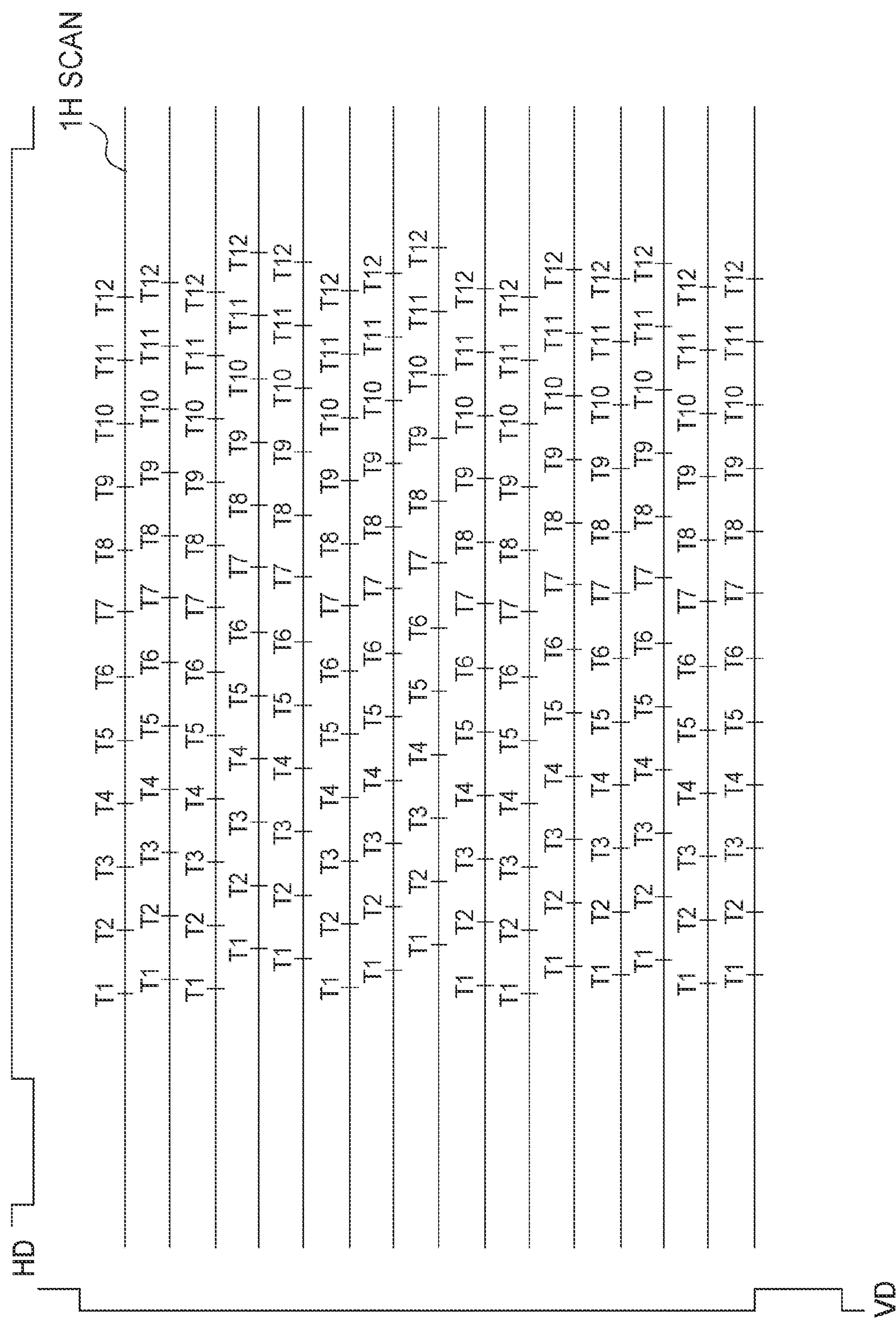
FIG. 3B is a schematic diagram for explaining that switching noises are different at each horizontal line.
Figure 9A:
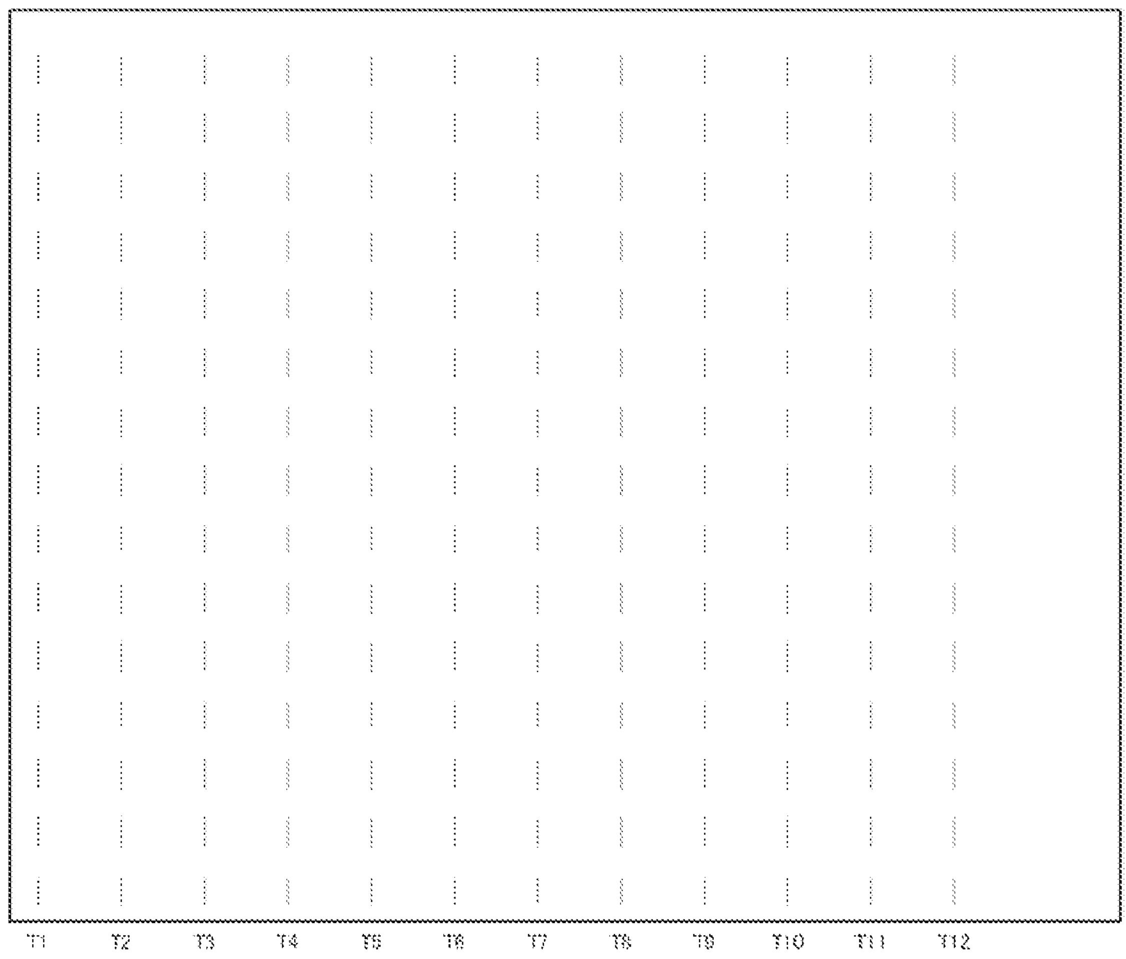
FIG. 9A is a schematic diagram for explaining linear image noises along a vertical direction.
Figure 9B:
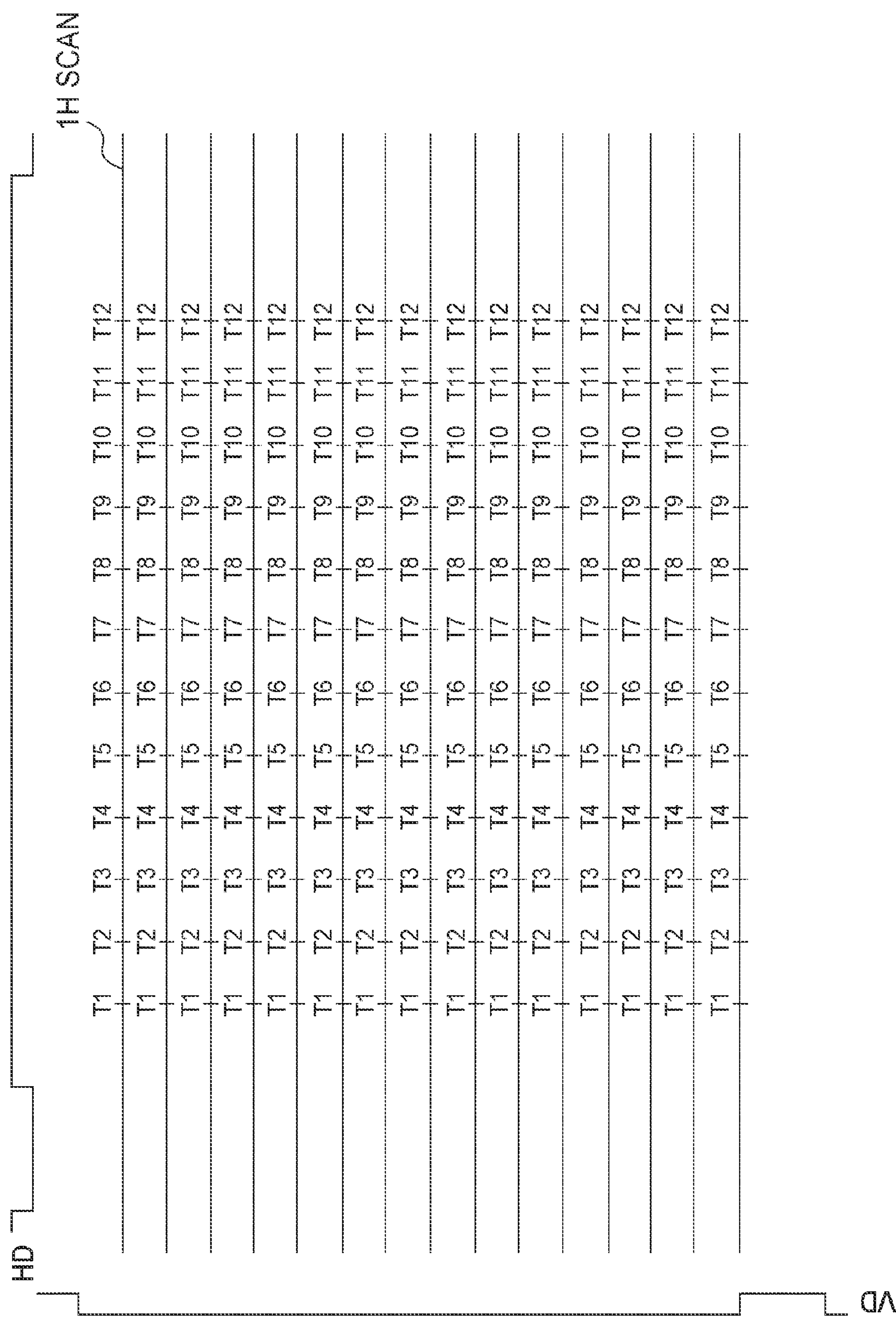
FIG. 9B is a schematic diagram for explaining that the timings when switching noises are generated are the same at all horizontal lines.

Namely, Vϕ pulses generated by the timing generator equipped with a conventional transfer pulse generator circuit have the T1 timings of all horizontal line lapsed by the Ta value from the fall of the horizontal sync signal HD, and have the same timings when switching noises are generated at all horizontal lines (refer to FIG. 9B). Vϕ pulses generated by the timing generator equipped with the transfer pulse generator circuit applied with the present invention have the T1 timings of all horizontal line lapsed by the Ta value from the rise of the horizontal sync signal HD and further lapsed by the RD_OFFSET value. The RD_OFFSET values take random values for respective horizontal lines and the timing when switching noises are generated is different at each horizontal line (refer to FIG. 3B). Therefore, FPNs generated at change timings T1 to T12 of respective horizontal lines will not be coupled vertically, and it is hard to generate vertical linear image noises and spot noises staying on the screen between fields and/or frames.

As described above, even if a vertical register transfer is performed during an effective pixel period by using vertical register transfer pulses generated by the timing generator equipped with the transfer pulse generator circuit applying the present invention, image noises are hard to be generated. It is therefore possible to perform the vertical register transfer during the effective pixel period without lowering the image quality and to realize a frame rate near a conventional frame rate even for a CCD type solid state image pickup device having a large number of pixels.

Figure 4:
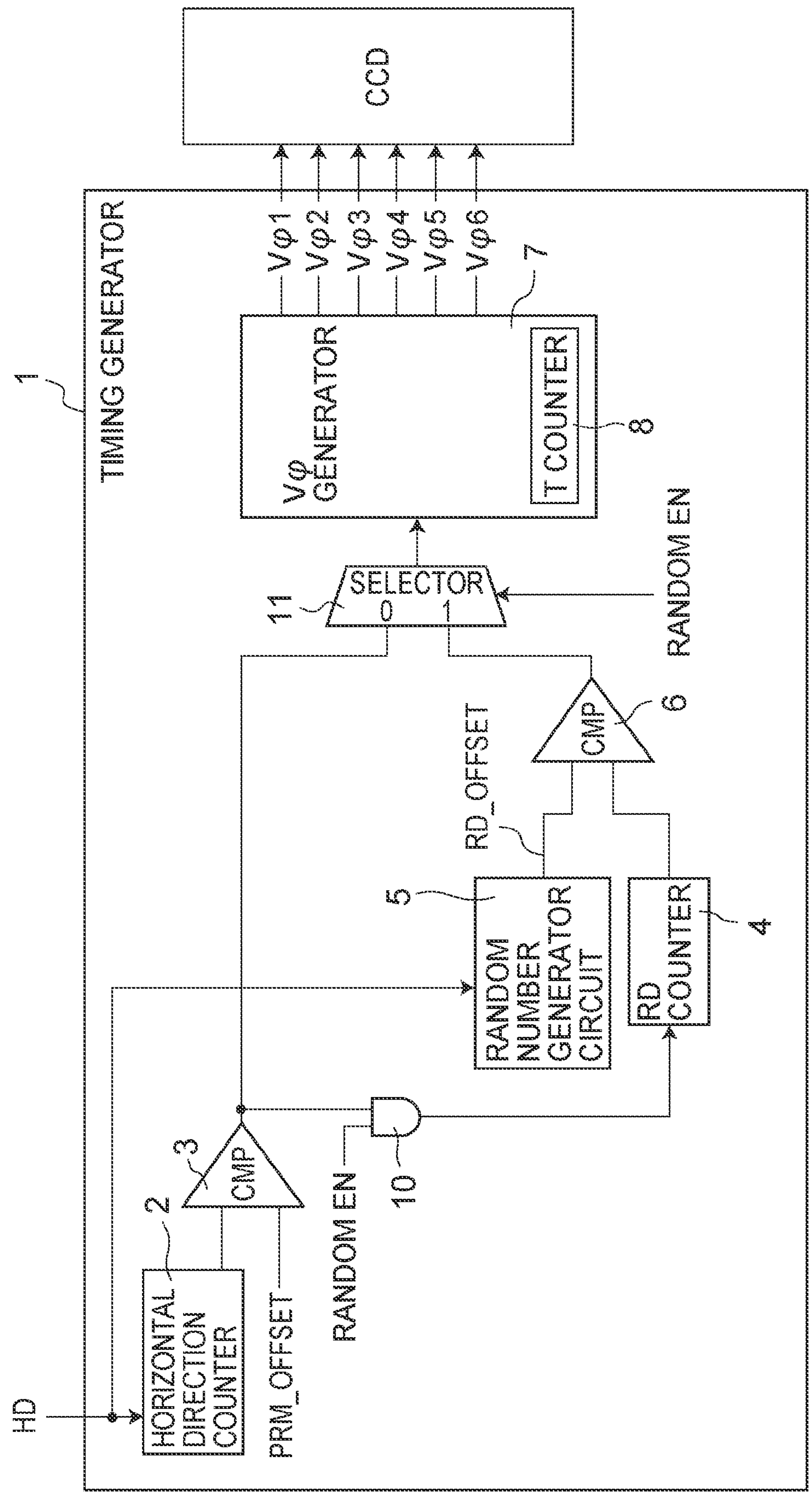
FIG. 4 is a schematic diagram for explaining a timing generator equipped with another example of a transfer pulse generator circuit applying the present invention.

FIG. 4 is a schematic diagram showing a timing generator equipped with another example of a transfer pulse generator circuit applying the present invention. A timing generator 1 shown in the drawing is constituted of: a horizontal direction counter 2 which starts counting synchronously with a fall of a horizontal sync signal HD; PRM_OFFSET which stores a count (Ta value) of the horizontal direction counter from the fall timing of the horizontal sync signal HD to a timing T1; a first comparator 3 which compares the count of the horizontal direction counter and the Ta value and outputs a first output signal when the count of the horizontal direction counter reaches the Ta value; an AND gate 10 which outputs a second output signal by inputting two input signals, the first output signal output from the first comparator and a random enable signal (random EN signal); an RD counter 4 which starts counting by using the second output signal output from the AND gate as a reference; a random number generator circuit 5 for determining an RD_OFFSET value which is an arbitrary value in a predetermined period, by using the fall of the horizontal sync signal HD as a trigger; a second comparator circuit 6 for comparing a count of the RD counter and the RD_OFFSET value and outputs a third output signal when the count of the RD counter reaches the RD_OFFSET value; a selector 11 which outputs the first output signal or third output signal in response to switching of the random EN signal by inputting two input signals, the third output signal output from the second comparator and the first output signal output from the first comparator; and a Vϕ generator 7 which generates a Vϕ pulse by using the first output signal or third output signal output from the selector as a trigger. Similar to the timing generator shown in FIG. 1, a T counter is provided in the Vϕ generator.

Description will now be made on the operation of the timing generator constructed as shown in FIG. 4, when the random EN signal is ON and OFF.

[ON of Random EN signal]

In the timing generator constructed as shown in FIG. 4, the horizontal direction counter starts counting synchronously with a fall of the horizontal sync signal HD which is a signal input externally, and the first comparator outputs the first output signal when the count of the horizontal direction counter reaches the Ta value stored in PRM_OFFSET.

Since the first output signal output from the first comparator and the random EN signal are input to the AND gate, the second output signal is output from the AND gate if the random EN signal is in an ON state, the RD counter starts counting by using the second output signal output from the first comparator as a reference, and the second comparator circuit outputs the third output signal when the count of the RD counter reaches the RD_OFFSET value determined by the random number generator circuit.

Since the third output signal output from the second comparator and the first output signal output from the first comparator are input to the selector, in the ON state of the random EN signal, the selector outputs the third output signal. By using the third output signal as a trigger, the Vϕ generator generates Vϕ1 to Vϕ6 pulses so that the vertical resister transfer pulses of one horizontal line can be obtained. If the random EN signal is ON, the vertical register transfer pulses similar to those generated by the timing generator shown in FIG. 1 can be generated.

[OFF of Random EN signal]

In the timing generator constructed as shown in FIG. 4, the horizontal direction counter starts counting synchronously with a fall of the horizontal sync signal HD which is a signal input externally, and the first comparator outputs the first output signal when the count of the horizontal direction counter reaches the Ta value stored in PRM_OFFSET.

Since the first output signal output from the first comparator and the random EN signal area input to the AND gate, the second output signal is not output from the AND gate if the random EN signal is in an OFF state.

The first output signal output from the first comparator is input to the selector, and in the OFF state of the random EN signal, the selector outputs the first output signal. By using the first output signal as a trigger, the Vϕ generator generates Vϕ1 to Vϕ6 pulses so that the vertical resister transfer pulses of one horizontal line can be obtained.

Figure 7:
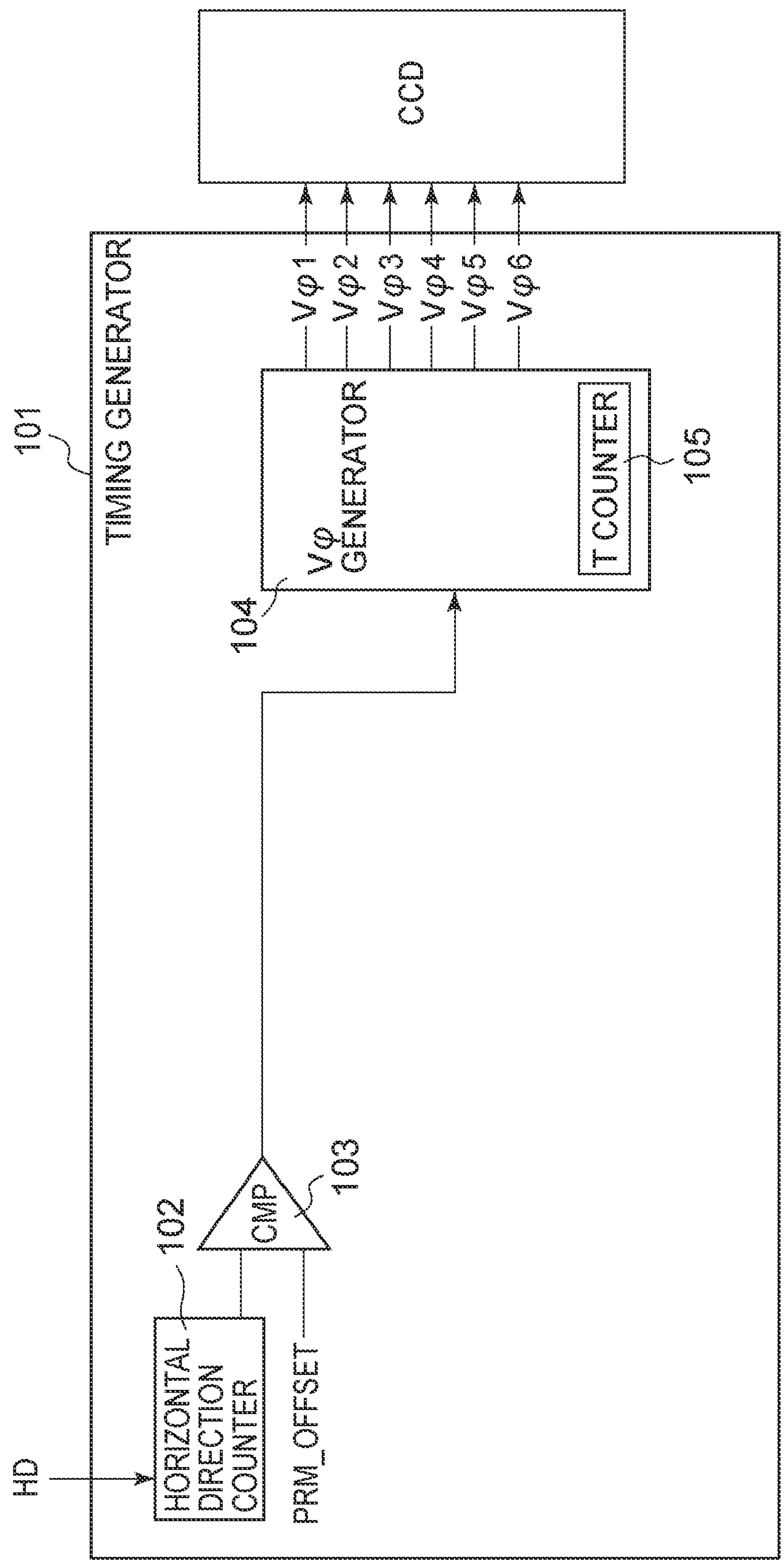
FIG. 7 is a schematic diagram for explaining a timing generator equipped with a conventional transfer pulse generator circuit.

If the random EN signal is OFF, the vertical register transfer pulses similar to those generated by the conventional timing generator shown in FIG. 7 can be generated.

In the timing generator equipped with the transfer pulse generator circuit applying the present invention and described above, by switching between ON and OFF of the random EN signal, it becomes possible to generate both vertical register transfer pulses having the same timings when switching noises are generated at all horizontal lines, and vertical register transfer pulses having different timings when switching noises are generated at each horizontal line.

Therefore, if it is necessary to perform a vertical register transfer during an effective pixel period, the random EN signal is turned ON to generate vertical register transfer pulses having different timings when switching noises are generated at each horizontal line. If it is not necessary to perform a vertical register transfer during an effective pixel period, the random EN signal is turned OFF to generate vertical register transfer pulses having the same timings when switching noises are generated at all horizontal lines. In this way, vertical register transfer pulses can be generated which are suitable for the vertical register transfer of each CCD type solid state image pickup device.

In this embodiment, although the timing T1 is made different at each horizontal line, the timings from the timing T1 to the timings T2 to T12 are constant. Namely, if the timing 1 is used as a reference, the timings T2 to T12 are the same for all horizontal lines. However, by making different of the timing T1 to be used as the reference, the timings T1 to T12 are made different for each horizontal line.

It is sufficient that the timings T1 to T12 are different for each horizontal line, and it is not necessarily required that the timings from the timing T1 to the timings T2 to T12 are made constant.

Also in this embodiment, timings when switching noises are generated at each horizontal line are made different, by making different at each horizontal line the signal (the second output signal for the timing generator shown in FIG. 1, and the third output signal for the timing generator shown in FIG. 4) used as the trigger for the Vϕ generator to generate the Vϕ pulse. However, it is sufficient that the Vϕ pulses generated by the timing generator generate switching noises at different timings for respective horizontal lines. For example, the Vϕ pulses generated by the Vϕ generator may be output via a delay circuit to the timing generator to generate switching noises at different timings for respective horizontal lines by making different the delay amount by the delay circuit.

If widths (period indicated by a symbol X in FIG. 8, hereinafter called random widths) of the timings T1 to T12 different at each horizontal line are set to a fixed value irrespective of the type and imaging mode of a CCD type solid state image pickup device, and regardless of a different effective pixel period depending upon the type and imaging mode of the CCD type solid state image pickup device, then the effective pixel period is divided into a region (region indicated by a symbol A in FIG. 8) where switching noises may be generated and a region (region indicated by a symbol B in the drawing) where switching noises may not be generated so that color shade may be formed in one screen. Similarly, when attention is paid to the rise or fall of an arbitrary Vϕ pulse, each overlap period (each period of T1 to T2, T2 to T3, T3 to T4, T4 to T5, T5 to T6, T6 to T7, T7 to T8, T8 to T9, T9 to T10, T10 to T11, and T11 to T12) of the Vϕ pulses is divided into a region (e.g., region indicated by a symbol C in FIG. 8 when attention is paid to the rise timing of Vϕ1) where switching noises may be generated and a region (e.g., region indicated by a symbol D in FIG. 8 when attention is paid to the rise timing of Vϕ1) where switching noises may not be generated so that color shade may be formed during the overlap period of the Vϕ pulses.

If the random width is fixed, the Vϕ pulse may enter from the preceding horizontal transfer period to the succeeding horizontal transfer period, depending upon the type and imaging mode of a CCD type solid state image pickup device. In this case, the vertical register transfer can not be established.

It is therefore requested that switching noises are generated averagely in one screen and during the overlap period of Vϕ pulses and that the random width is determined to allow normal vertical register transfer. To this end, it is preferable in some cases not to set the random width to a fixed value, but to set the random width variably.

Description will now be made on a timing generator capable of setting the random width variably.

Figure 10:
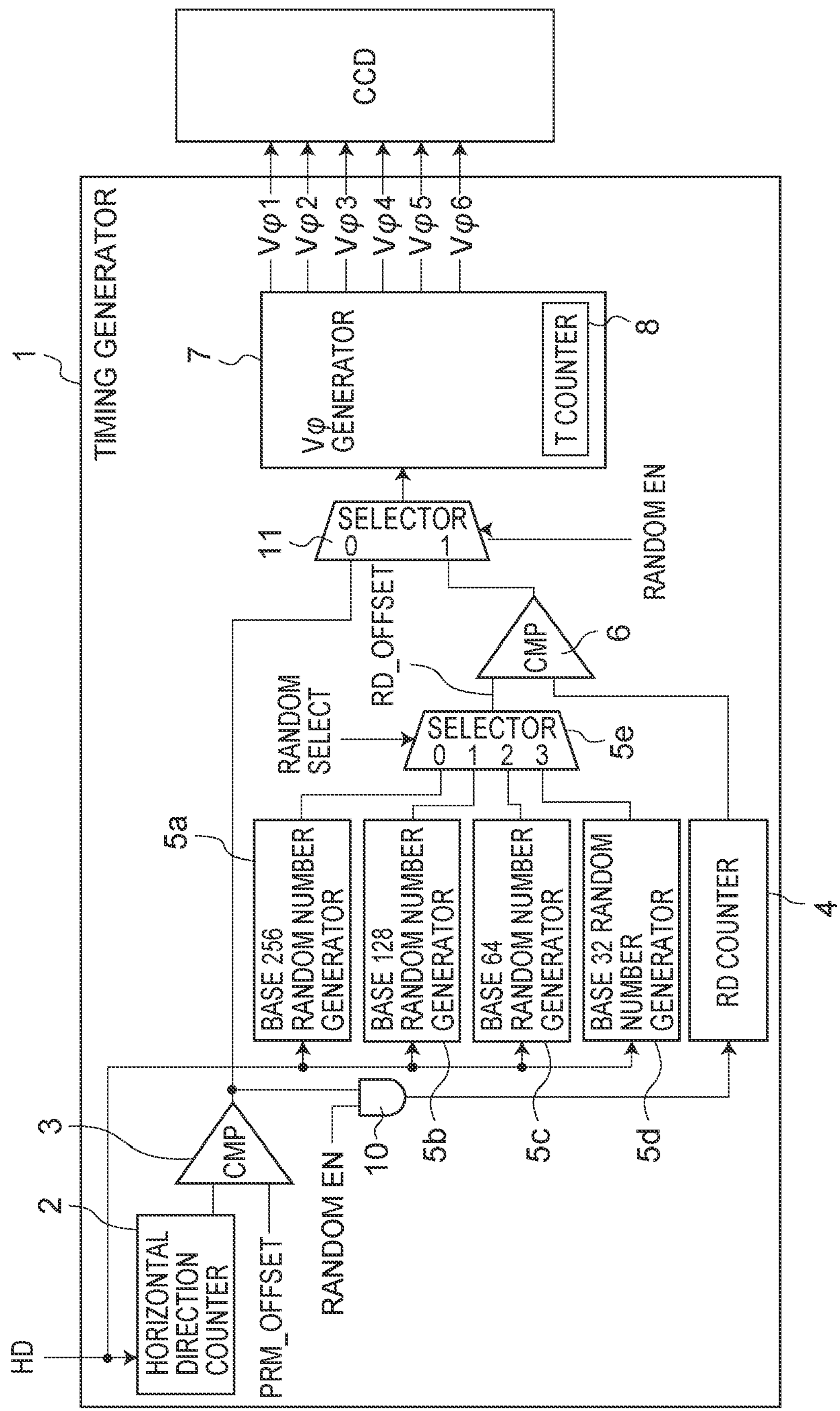
FIG. 10 is a schematic diagram for explaining a timing generator equipped with another example of a transfer pulse generator circuit applying the present invention.

FIG. 10 is a schematic diagram showing a timing generator equipped with still another example of a transfer pulse generator circuit applying the present invention. A timing generator 1 shown in the drawing is constituted of: a horizontal direction counter 2 which starts counting synchronously with a fall of a horizontal sync signal HD; PRM_OFFSET which stores a count (Ta value) of the horizontal direction counter from the fall timing of the horizontal sync signal HD to a timing T1; a first comparator 3 which compares the count of the horizontal direction counter and the Ta value and outputs a first output signal when the count of the horizontal direction counter reaches the Ta value; an AND gate 10 which outputs a second output signal by inputting two input signals, the first output signal output from the first comparator and a random enable signal (random EN signal); an RD counter 4 which starts counting by using the second output signal output from the AND gate as a reference; a random number generator circuit S for determining an RD_OFFSET value which is an arbitrary value in a predetermined period, by using the fall of the horizontal sync signal HD as a trigger (a first random number generator circuit unit 5*a* (base 256 random number generator circuit), a second random number generator circuit unit 5*b* (base 128 random number generator circuit), a third random number generator circuit unit 5*c* (base 64 random number generator circuit), a fourth random number generator circuit unit 5*d* (base 32 random number generator circuit), and a random number generator circuit unit selector 5*e* for selecting one of the first to fourth random number generator circuit units in accordance with an externally input random number generator circuit select signal (random select)); a second comparator circuit 6 for comparing a count of the RD counter and the RD_OFFSET value and outputs a third output signal when the count of the RD counter reaches the RD_OFFSET value; a selector 11 which outputs the first output signal or third output signal in response to switching of the random EN signal by inputting two input signals, the third output signal output from the second comparator and the first output signal output from the first comparator; and a Vϕ generator 7 which generates a Vϕ pulse by using the first output signal or third output signal output from the selector as a trigger. Similar to the timing generator shown in FIG. 1, a T counter is provided in the Vϕ generator.

Description will now be made on the operation of the timing generator constructed as shown in FIG. 10. The operation when the random EN signal is OFF is similar to the operation of the timing generator equipped with the other example of the transfer pulse generator circuit applying the present invention and described above. Therefore, in the following, description will be made only on the operation when the random EN signal is ON.

In the timing generator (random signal is ON) constructed as shown in FIG. 10, the horizontal direction counter starts counting synchronously with a fall of the horizontal sync signal HD which is a signal input externally, and the first comparator outputs the first output signal when the count of the horizontal direction counter reaches the Ta value stored in PRM_OFFSET.

Since the first output signal output from the first comparator and the random EN signal are input to the AND gate, the second output signal is output from the AND gate in a random EN signal ON state, the RD counter starts counting by using the second output signal output from the first comparator as a reference, and the second comparator circuit outputs the third output signal when the count of the RD counter reaches the RD_OFFSET value determined by the random number generator circuit.

The RD_OFFSET value is determined by which of the first to fourth random number generator circuit units is selected in accordance with the random number generator circuit select signal input to the random number generator circuit unit selector, and can be variably controlled.

Since the third output signal output from the second comparator and the first output signal output from the first comparator are input to the selector, in the ON state of the random EN signal, the selector outputs the third output signal. By using the third output signal as a trigger, the Vϕ generator generates Vϕ1 to Vϕ6 pulses so that the vertical resister transfer pulses of one horizontal line can be obtained.

In the timing generator equipped with the transfer pulse generator circuit applying the present invention and described above, the random width can be set variably. The random width can be selectively switched among base 32, base 64, base 128 and base 256 random numbers.

Figure 8:
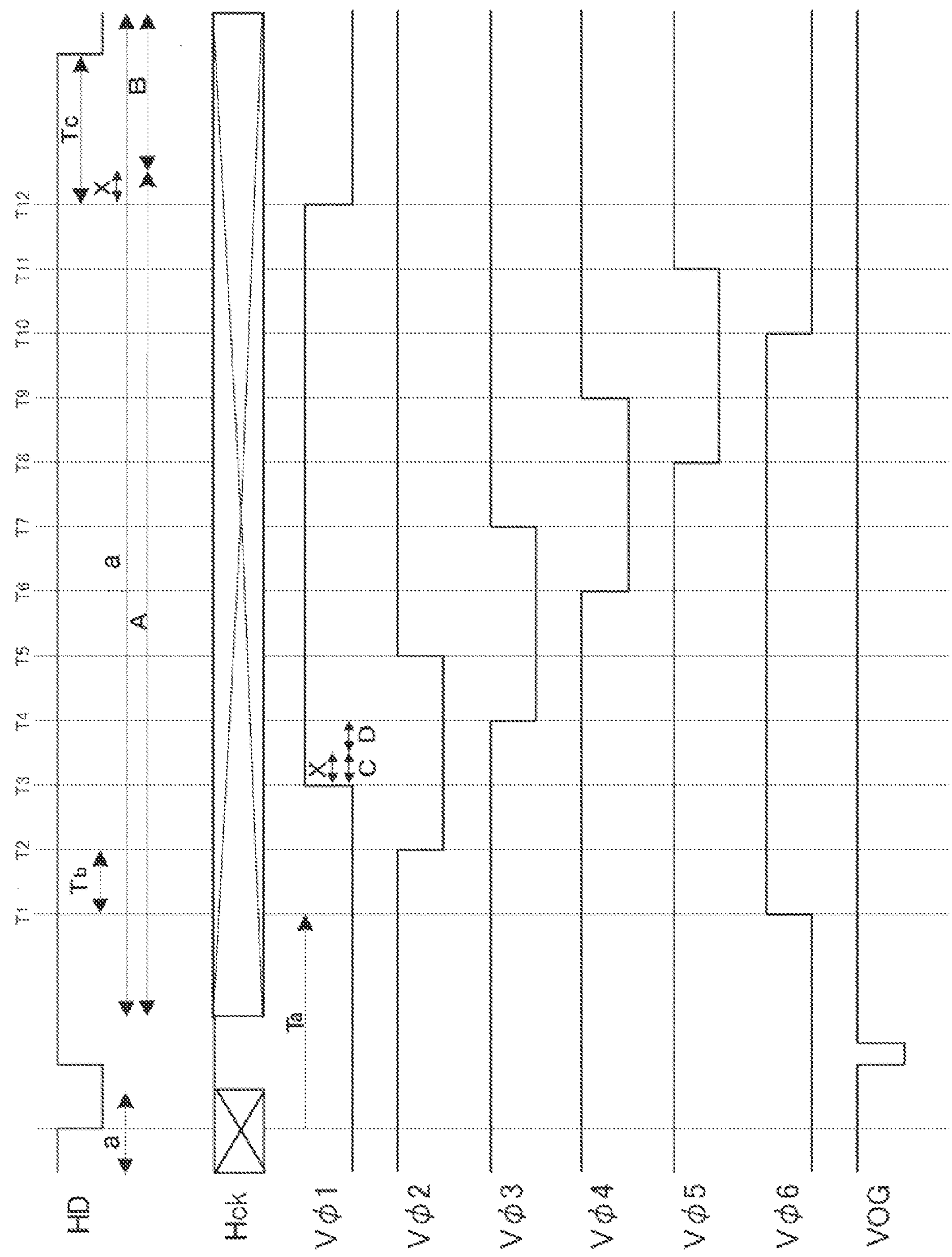
FIG. 8 is an example of a timing chart illustrating a driving method which performs a vertical register transfer during an effective pixel period.

It is preferable that the random width X is set to substantially the same as the period to termination of the effective pixel period after generation of the Vϕ pulse (period indicated by a symbol Tc in FIG. 8). By setting in this way, without dividing the effective pixel period into the region where switching noises may be generated and the region where switching noises may not be generated, the generation of color shade in one screen can be suppressed because switching noises may be generated in all the region during the effective pixel period.

It is preferable that the random width X is set to substantially the same as the overlap period of Vϕ pulses. By setting in this way, without dividing the overlap period of Vϕ pulses into the region where switching noises may be generated and the region where switching noises may not be generated, the generation of color shade during the overlap period of Vϕ pulses can be suppressed because switching noises may be generated in all the region during the overlap period of Vϕ pulses.

Figure 11:
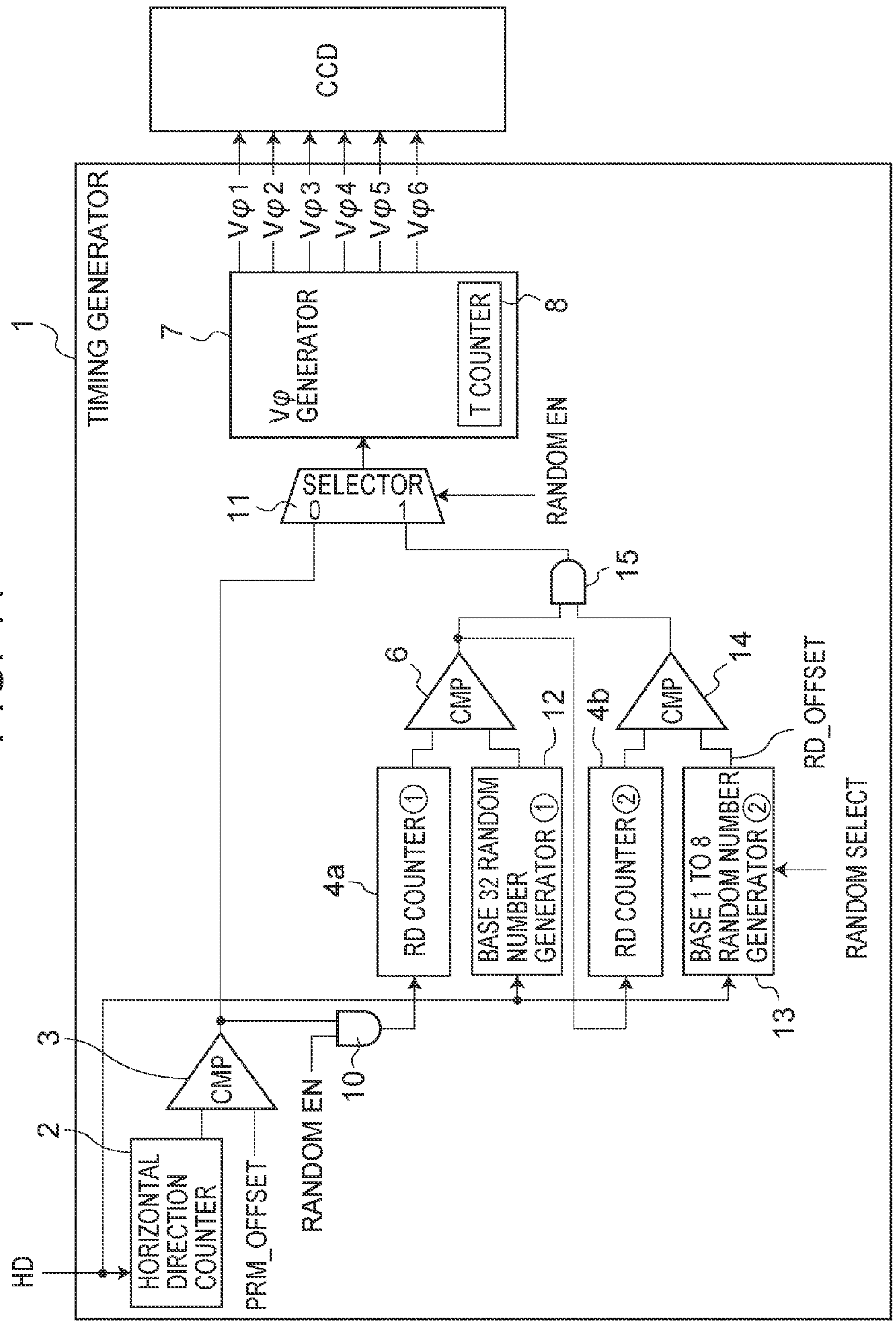
FIG. 11 is a schematic diagram for explaining a timing generator equipped with a modification of the other example of the transfer pulse generator circuit applying the present invention.
Figure 12:
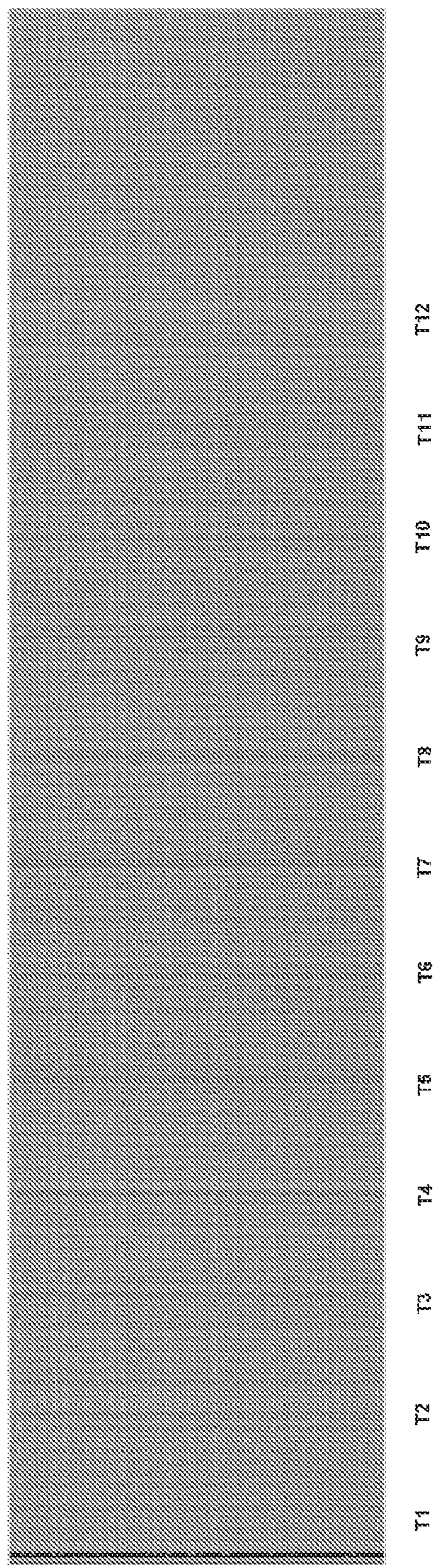
FIG. 12 is a screen image in which random noise patterns are generated.

As the random width is set in accordance with the type and imaging mode of a CCD type solid state image pickup device, it is necessarily possible to avoid the phenomenon that the vertical transfer can be performed normally. Further, it is possible to satisfy the need for adjusting the random width at a performance evaluation site while viewing an actual output image. FIG. 11 is a schematic diagram showing a timing generator equipped with a modification of still another example of a transfer pulse generator circuit applying the present invention. A timing generator 1 shown in the drawing is constituted of: a horizontal direction counter 2 which starts counting synchronously with a fall of a horizontal sync signal HD; PRM_OFFSET which stores a count (Ta value) of the horizontal direction counter from the fall timing of the horizontal sync signal HD and a timing T1; a first comparator 3 which compares the count of the horizontal direction counter and the Ta value and outputs a first output signal when the count of the horizontal direction counter reaches the Ta value; an AND gate 10 which outputs a second output signal by inputting two input signals, the first output signal output from the first comparator and a random EN signal; a first RD counter 4*a* which starts counting by using the second output signal output from the AND gate as a reference; a first random number generator circuit 12 (base 32 random number generator circuit) for determining an arbitrary value in a predetermined period, by using the fall of the horizontal sync signal HD as a trigger; a second comparator 6 for comparing a count of the first RD counter and an output value of the first random number generator circuit and outputs a third output signal when the count of the first RD counter reaches the output value of the first random number generator circuit; a second RD counter 4*b* which starts counting by using the third output signal output from the second comparator as a reference; a second random number generator circuit 13 (although not shown, similar to the random number generator circuit equipped with the still other example of the transfer pulse generator circuit applying the present invention and described earlier, the second random number generator circuit is constituted of a fifth random number generator circuit unit (base 1 random number generator circuit), a sixth random number generator circuit unit (base 2 random number generator circuit), a seventh random number generator circuit unit (base 3 random number generator circuit), an eighth random number generator circuit unit (base 4 random number generator circuit), a ninth random number generator circuit unit (base 5 random number generator circuit), a tenth random number generator circuit unit (base 6 random number generator circuit), an eleventh random number generator circuit unit (base 7 random number generator circuit), a twelfth random number generator circuit unit (base 8 random number generator circuit), and a random number generator circuit unit selector for selecting one of the fifth to twelfth random number generator circuit units in accordance with an externally input random number generator circuit select signal (random select)) for determining an RD_OFFSET value which is an arbitrary value in a predetermined period, by using the fall of the horizontal sync signal HD as a trigger; a third comparator 14 for comparing the count of the second RD counter and the RD_OFFSET value and outputs a fourth output signal when the count of the second RD counter reaches the RD_OFFSET value; an AND gate 15 for outputting a fifth output signal by inputting two input signals, the third output signal output from the second comparator and the fourth output signal output from the third comparator; a selector 11 which outputs the first output signal or fifth output signal in response to switching of a random EN signal by inputting two input signals, the fifth output signal output from the AND gate and the first output signal output from the first comparator; and a Vϕ generator 7 which generates a Vϕ pulse by using the first output signal or fifth output signal output from the selector as a trigger.

In the timing generator equipped with the transfer pulse generator circuit applying the present invention and described above, two random number generator circuits are used and the outputs are multiplied so that a plurality of random widths can be changed easily.

Namely, in the case of the timing generator shown in FIG. 10, although selection of about four random widths is practical, the circuit scale becomes large if the number of widths to be selected is increased. In this modification, the base of the random number of the second random signal generator circuit is determined by the random number generator circuit select signal. The random number of the base determined in the second random number generator circuit is multiplied by the base 32 random number generated by the first random number generator circuit. It is therefore possible to change the eight random widths of random numbers of 32×1=base 32, 32×2=base 64, 32×3=base 96, 32×4=base 128, 32×5=base 160, 32×6=base 192, 32×7=base 224 and 32×8=base 256, without increasing the circuit scale.

The present invention contains subject mater related to Japanese Patent Application Nos. JP2006-006652 and JP2006-283535, filed in the Japanese Patent Office respectively on Jan. 13, 2006 and Oct. 18, 2006, the entire contents of which being incorporated herein by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A transfer pulse generator circuit for outputting a vertical register transfer pulse, comprising:

transfer pulse generator means for generating said vertical register transfer pulse; and transfer pulse control means for controlling rise and fall timings of said vertical register transfer pulse to desired timings in a predetermined period.

2. The transfer pulse generator circuit according to claim 1, wherein said predetermined period is substantially the same as a period to termination of an effective pixel period after a generation period of said vertical register transfer pulse.

3. The transfer pulse generator circuit according to claim 1, wherein said predetermined period is substantially the same as an overlap period of said vertical register transfer pulse.

4. A transfer pulse generator circuit comprising:

reference signal output means for outputting a reference signal for generating a vertical register transfer pulse; and transfer pulse generator means for generating said vertical register transfer pulse by using said reference signal as a trigger, wherein said reference signal output means outputs said reference signal at a desired timing in a predetermined period.

5. The transfer pulse generator circuit according to claim 4, wherein said reference signal output means comprises:

a first counter for counting a clock used as a reference;

a first comparator for comparing a count of said first counter and a predetermined value, and outputting a signal;

a second counter for counting said clock by using said signal as a trigger;

a random number generator circuit for outputting an arbitrary value in a predetermined period; and a second comparator for comparing a count of said second counter and an output value of said random number generator circuit, and outputting said reference signal.

6. The transfer pulse generator circuit according to claim 5, wherein said random number generator circuit comprises two or more random number generator circuit units and a selector alternatively selecting one of said random number generator circuit units, and wherein said random number generator circuit outputs a value of the random number generator circuit unit selected by said selector.

7. An image pickup apparatus having a transfer pulse generator circuit, said transfer pulse generator circuit comprising:

reference signal output means having a first counter for counting a clock used as a reference, a first comparator for outputting a signal by comparing a count of said first counter and a first predetermined value, a second counter for counting said clock by using said signal as a trigger, and a second comparator for outputting a reference signal by comparing a count of said second counter and a second predetermined value; and transfer pulse generator means for generating a vertical register transfer pulse by using said reference signal as a trigger, wherein said second predetermined value is an output value of a random number generator circuit which outputs a desired value in a predetermined period.

* * * * *